(12) United States Patent
Kato et al.

(10) Patent No.: US 6,809,340 B2
(45) Date of Patent: Oct. 26, 2004

(54) LIGHT EMITTING ELEMENT

(75) Inventors: Hideaki Kato, Aichi (JP); Yoshinobu Suehiro, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/246,409

(22) Filed: Sep. 19, 2002

(65) Prior Publication Data

US 2003/0062529 A1 Apr. 3, 2003

(30) Foreign Application Priority Data

Sep. 28, 2001 (JP) ........................................ 2001-304033

(51) Int. Cl.[7] ............................................... H01L 27/15
(52) U.S. Cl. ............................. 257/79; 257/13; 257/82; 257/89; 257/94; 257/98; 257/99; 257/103
(58) Field of Search .................................. 257/13, 79, 80, 257/82, 89, 93, 98, 99, 103, 918, 91

(56) References Cited

U.S. PATENT DOCUMENTS 3,954,534 A * 5/1976 Scifres et al. .................. 156/7
6,107,644 A * 8/2000 Shakuda et al. ............... 257/79
6,177,710 B1 * 1/2001 Nishikata et al. ........... 257/429

FOREIGN PATENT DOCUMENTS

JP 05-167101 7/1993
JP 2000-196152 7/2000

* cited by examiner

Primary Examiner—Long Pham
Assistant Examiner—Wai-Sing Louie
(74) Attorney, Agent, or Firm—McGinn & Gibb, PLLC

(57) ABSTRACT

Irregularities are formed on at least a side surface of a light emitting layer of a light emitting element. In one form of the invention, an n-type layer which is a Group-III nitride compound semiconductor or the like, a light emitting layer, and a p-type layer are successively formed on a sapphire substrate through MOVPE or the like. Then, dry etching is carried out to expose the n-type layer to form a pedestal electrode. In this etching process, an etching pattern is employed to form a wave shape on the periphery of the p-type layer.

16 Claims, 11 Drawing Sheets

LIGHT EMITTING ELEMENT

The present application claims the Convention priority from Japanese Patent Application No. 2001-304033, the complete disclosures of which are hereby incorporated herein by reference.

BACKGROUND OF THE INVENTION

1. Field of the Invention

The present invention relates to a light emitting element. More particularly, it relates to a light emitting element in which surface irregularities are formed on at least a side surface of a light emitting region formed on a substrate, and light is radiated from the side surface so as to increase the external quantum efficiency of the light emitting element.

The present invention can be applied to a light emitting element such as an LED which requires an increased external quantum efficiency.

2. Related Art

From in the past, there have existed semiconductor light emitting elements in which irregularities are formed on the top surface of a light emitting element to increase the light emitting efficiency. Examples of such light emitting elements are the semiconductor light emitting element disclosed in Japanese Patent Application Laid-Open (kokai) No. 5-167101 and the semiconductor light emitting element and manufacturing method therefor disclosed in Japanese Patent Application Laid-Open (kokai) No. 2000-196152. The semiconductor light emitting element disclosed in Japanese Patent Application Laid-Open (kokai) No. 5-167101 is shown in FIG. 11. The semiconductor light emitting element shown in FIG. 11 comprises a compound semiconductor substrate 1 made of n-GaAs or the like, a light reflecting layer 6, light emitting layers 20, a current dispersing layer 3, a light scattering layer 10, and electrodes 4 and 5. The light emitting layers 20 comprise an n-InAlP layer 21, an InGaAlP layer 23, and a p-InAlP layer 22.

The invention disclosed in that publication is characterized in that the light scattering layer 10, which is made of GaP or the like, is formed on the current dispersing layer 3. The light scattering layer 10, which is formed by incomplete growth, has a different lattice constant from the current dispersing layer 3. As a result, total reflection by the surface (the interface with the air) does not occur, and thus light is output with approximately two times the efficiency compared to when light is output from the glossy surface of the current dispersing layer 3.

The semiconductor light emitting element disclosed in Japanese Patent Application Laid-Open (kokai) No. 2000-196152 is shown in FIG. 12. It has a structure in which an n-GaN layer 52, an InGaN light emitting layer 53, and a p-GaN layer 54 are stacked atop a sapphire substrate 51, an electrode 55 is formed atop a portion of the p-GaN layer 54, and an electrode 56 is formed atop a portion of the n-GaN layer 52. The light emitting element is characterized in that the surface 54a of the p-GaN layer 54 is formed to have a plurality of cylindrical lenses. If the surface of the p-GaN layer 54 were made flat in the conventional manner, of the light emitted by the InGaN light emitting layer 53, only the light which fulfilled certain conditions (i.e., light incident within a critical angle of about 21.9° centered on a line normal to the surface) would be radiated to the exterior, and the other incident light would be confined by total reflection and attenuated.

However, in that invention, a plurality of cylindrical lenses are formed on the surface of the p-GaN layer 54, so the conditions determining which light can be radiated are relaxed. Thus, the radiation efficiency is increased by making the surface cylindrical.

However, neither of the above prior art examples takes any step with respect to light which is propagated lateral within the light emitting layers. As shown in FIG. 13A and FIG. 13B which are respectively a schematic vertical cross-sectional view and a plan view of a typical semiconductor light emitting element having a rectangular shape, no matter how many times light is reflected within the layer, there is a large amount of light which has an angle of incidence larger than the critical angle, and this light continues to be internally reflected, causing a decrease in the external quantum efficiency of the light emitting element.

In the semiconductor light emitting element disclosed in Japanese Patent Application Laid-Open (kokai) No. 2000-196152, forming cylindrical irregularities on the surface of a light emitting layer does in fact increase the external quantum efficiency, but the layer having the cylindrical irregularities is thin, and therefore, it is difficult to accurately form the irregularities thereon. In addition, with a stable material such as GaN, it is not possible to form random irregularities on the top surface of the material by surface treatment such as chemical etching, which was conventionally carried out for GaP and similar materials. On the other hand, physical methods of forming the cylindrical irregularities are difficult and suffer from poor productivity.

SUMMARY OF THE INVENTION

The present invention was made in order to solve the above-described problems. One object of the present invention is to increase the area of a crystal interface of a light emitting element without changing the light density within the crystal; i.e., without changing the size of the crystal, and to thereby increase the external radiation area with respect to emitted light present at random locations and having random orientations within the crystal, and to increase the efficiency of light radiation; i.e., to increase the external quantum efficiency. Another object of the present invention is to achieve such an increase in external quantum efficiency by a simple method so as to permit mass production of an improved light emitting element.

Yet another object of the present invention is to provide a light emitting element having surface irregularities on a side surface and on a top surface of a light emitting element so as to further increase the external quantum efficiency of the light emitting element.

A still further object of the present invention is to provide a light emitting element having a tapered side formed with surface irregularities so as to increase the light emitting efficiency of the light emitting element in the direction perpendicular to a substrate of the light emitting element.

While the various aspects of the present invention can collectively achieve all of the above objects, it should be understood that a single aspect does not necessarily achieve all of the above objects.

According to one form of the present invention, a light emitting element comprises a solid light emitting element having a light emitting region comprising at least one layer, with at least a portion of a side surface of the light emitting region having surface irregularities thereon.

The light emitting region may comprise a single layer or a plurality of layers. When the light emitting region comprises a semiconductor, the semiconductor may be either a p-type or an n-type. When the light emitting region comprises a plurality of layers, the different layers may contain the same compositional proportions having different impurity concentrations in each other, or the layers may differ in compositional proportion or in constituent element. In the latter case, the concentration of added impurities may differ among the plurality of layers. The light emitting region may be non-doped, or it may be an n-type or p-type semiconductor. Layers having various functions may be provided above or below the light emitting region. Such layers can be n-layers, p-layers, or non-doped layers. When the light emitting element is a semiconductor light emitting element, it may employ various structures, such as a homo pn structure, a single hetero structure, or a double hetero structure. The light emitting region can employ a single quantum well structure, a multiple quantum well structure, or the like.

The present invention can be applied not only to an injection type LED but to an intrinsic EL.

In this form of the invention, surface irregularities are on at least a side surface of the light emitting region, but surface irregularities can also be formed on a side surface of regions other than the light emitting region. The surface irregularities can be formed around all or a portion of the periphery of the light emitting region or other region. The larger the portion of the periphery on which surface irregularities are formed, the greater is the effect of the surface irregularities on discharging light. Some examples of situations in which surface irregularities are formed on only a portion of the periphery of a light emitting element are when they are formed on a single side or on opposite sides of a rectangular light emitting element.

The surface irregularities can have a variety of shapes. In one form of the present invention, the surface irregularities are curves having a varying curvature. In this case, in a horizontal cross section the irregularities is a curved line. One example of a curved shape is a curved pillar. The curved pillar may be sloping to the perpendicular direction to the substrate.

In one form of the present invention, the light emitting element is tapered in the light emitting region so that the side surface having surface irregularities is non-perpendicular with respect to a substrate.

The surface irregularities can be formed by a variety of methods. In one form of the present invention, the surface irregularities are formed by etching.

According to another form of the present invention, the surface irregularities are formed by patterning of the light emitting region.

According to yet another form of the present invention, the surface irregularities are formed when a plurality of light emitting elements are separated from each other.

In a preferred embodiment, the light emitting element is formed on a substrate, and the refractive index of the substrate is smaller than the refractive index of the light emitting region having one or more layers.

A low temperature growth buffer layer or a high temperature growth buffer layer may be formed atop the substrate. These buffer layers may comprise a plurality of layers. A buffer layer and a monocrystal layer may alternate with each other.

The substrate may comprise electrically conductive materials or electrically insulating materials. When an electrically conductive material is used to form the substrate, two electrodes can be formed on opposite sides of the substrate. When an electrically insulating material is used to form the substrate, both electrodes are formed on the top surface of the substrate.

According to one form of the present invention, each layer formed on the substrate comprises a Group-III nitride compound semiconductor.

Surface irregularities may be formed not only on a side surface of the light emitting region but may also be formed on the top surface of the light emitting element.

The benefits of the above-described various forms of the present invention will next be described.

As stated above, according to one form of the present invention, a light emitting element comprises a solid light emitting element having a light emitting region comprising at least one layer, with at least a portion of a side surface of the light emitting region having surface irregularities thereon.

Normally, in a light emitting element, light which is generated within a light emitting region is radiated in all directions, but only light in the direction approximately perpendicular to the substrate is radiated in the perpendicular direction to the substrate. Of that light from the light emitting region which is incident on layers above it, such as a p-layer when the light emitting element is a semiconductor light emitting diode (a p-layer when a p-layer is formed above the light emitting region and an n-layer when an n-layer is formed above the light emitting region), that light which is incident within a critical angle is radiated in the direction perpendicular to the substrate. However, since the p-layer (such as a p-GaN layer) and the light emitting region have a refractive index which is higher than the exterior region, light having an angle of incidence which is larger than the critical angle is totally reflected by the p-layer and returns to the light emitting region. Thus, the greater portion of the light is confined within the light emitting region and is attenuated. Therefore, the light which was generated within the light emitting region of a conventional light emitting element was not all efficiently radiated.

However, according to one form of the present invention, surface irregularities are formed on at least a portion of a side surface of the light emitting region. If a side surface of the light emitting region has an irregular shape, normal lines to the side surface extend in various directions. Varying the direction of normal lines to the side surface causes the critical angle to also vary. As a result, light which would have been confined within the light emitting region and particularly light which would have been confined in the lateral direction can be efficiently radiated, and a large portion of light which conventionally could not be radiated can be radiated to the exterior of the light emitting element, so the external quantum efficiency of the light emitting element can be greatly increased. The surface irregularities can have any desired shape. For example, they can have the shape of triangular waves or sinusoidal waves. The shape and the size may vary randomly, or they may be periodic.

As stated above, the surface irregularities may be curves having a varying curvature; i.e., the radius of curvature of the surface irregularities may vary. By having a varying curvature, the critical angle is not fixed as in the case of a flat surface, and thus the critical angle varies, and the overall amount of light which can be radiated from the light emitting element is increased. This is equivalent to increasing the effective radiation area of light. In this manner, light which is generated in the light emitting region can be efficiently radiated to the exterior of the light emitting region, whereby a light emitting element having a higher external quantum efficiency is obtained.

As stated above, the light emitting element may be tapered in the light emitting region so that the side surface having surface irregularities is non-perpendicular with respect to a substrate. If normal lines to the side surface and normal lines to the top surface of the light emitting region are not perpendicular to each other, the area of the side surface can be increased. Accordingly, light which was internally reflected in the lateral direction can be more efficiently radiated to the exterior of the light emitting element. If normal lines to the side surface have a positive angle of slope, light which is radiated from the side surface has a positive angle of slope. Due to the positive angle of slope, the light which is radiated from the side surface is effectively radiated in the upwards direction. Alternatively, the radiated light may have a negative angle of slope. In this case, light which is radiated from the light emitting region reflects off the surface of a substrate on which the light emitting region is formed and then is again radiated upwards.

As stated above, one possible method of forming the surface irregularities is by etching.

When a light emitting element employs an electrically insulating substrate, an n-type layer is formed on the bottom surface. In the case of an element structure in which a positive and negative electrode are formed on the upper side of the substrate, it is necessary to dig down by etching in each layer in order to form an electrode in the n-type layer. At this time, an irregular pattern can be formed on the top surface by a mask, a resist or the like. If digging is performed through each layer by etching with the pattern formed in this manner, irregularities in the shape of an etching pattern are formed on the side surface of the light emitting region to form an irregular side surface. The irregular side surface is formed by etching, so it can be easily formed.

As stated above, another method of forming the surface irregularities in a side surface of the light emitting region is by patterning of the light emitting region.

For example, if the surface irregularities are formed by patterning on a light emitting region formed by organic metal compound vapor phase growth, the shape of the surface irregularities can be chosen at will, and a wide variety of shapes are possible, such as triangular wave shapes, sine wave shapes, and random shapes. In addition, patterning makes it possible to strictly control the shape of the surface irregularities such that light which is radiated from any point on the side surface is not blocked by another of the surface irregularities. Accordingly, the shape of the side surface can be optimized, and light can be more efficiently radiated.

As stated above, the surface irregularities can also be formed as part of the process of separating a plurality of light emitting elements from each other. In this case, surface irregularities can be easily formed on the side surface without the need for a separate and independent step of forming irregularities, and thus surface irregularities can be formed with no increase in manufacturing costs.

As stated above, a light emitting element according to the present invention can be formed atop a substrate, with the refractive index of the substrate being smaller than the refractive index of the light emitting region.

If the refractive index of the substrate is smaller than the refractive index of the light emitting region, it becomes easy to obtain total reflection from the substrate, and a portion of the light which is generated in the light emitting region is propagated in the lateral direction within the light emitting region. For example, in view that a GaN-type semiconductor layer has a refractive index of approximately 2.4, an alumina-group substrate having a refractive index of 1.7 can be used. As a result, light emitted by the light emitting region is totally reflected by the substrate, and it reaches the side surface of the light emitting region, from where it is radiated. Therefore, a light emitting element having an even higher external quantum efficiency can be obtained.

As stated above, each layer formed on the substrate may comprise a Group-III nitride compound semiconductor.

When a Group-III nitride compound semiconductor is used to form a light emitting element, it is a direct transition type semiconductor having a wide emission spectrum ranging from ultraviolet to red. Accordingly, it can be used to manufacture light emitting diodes (LED's) having various emission spectra.

The band gap of a Group-III nitride compound semiconductor is broad, so a light emitting element can be achieved which can stably operate at higher temperatures than elements using other types of semiconductors. In addition, a Group-III nitride compound semiconductor does not use arsenic (As) as a main component, and therefore, a light emitting element can be achieved which is safe from an environmental standpoint.

As stated above, a light emitting element according to the present invention may have surface irregularities formed not only on a side surface of its light emitting region but also on its top surface.

Irregularities are effective not only on the side surface of the light emitting region but also on the top surface of the light discharging surface. Surface irregularities on the top surface can increase the effectiveness of light radiation from the top surface for the same reasons that surface irregularities on a side surface can increase the effectiveness of light radiation from the side surface. Light can be more effectively radiated from the side surface and the top surface; therefore, by forming surface irregularities on the top surface, a light emitting element can be obtained with further increased quantum efficiency.

DESCRIPTION OF PREFERRED EMBODIMENTS

A number of preferred embodiments of the present invention will next be described. It should be understood that these embodiments are merely examples, and the present invention is not limited to the features shown in the embodiments. And the example disclosed in the summary is a preferable embodiment of the present invention.

(First Embodiment)

Figure 1:
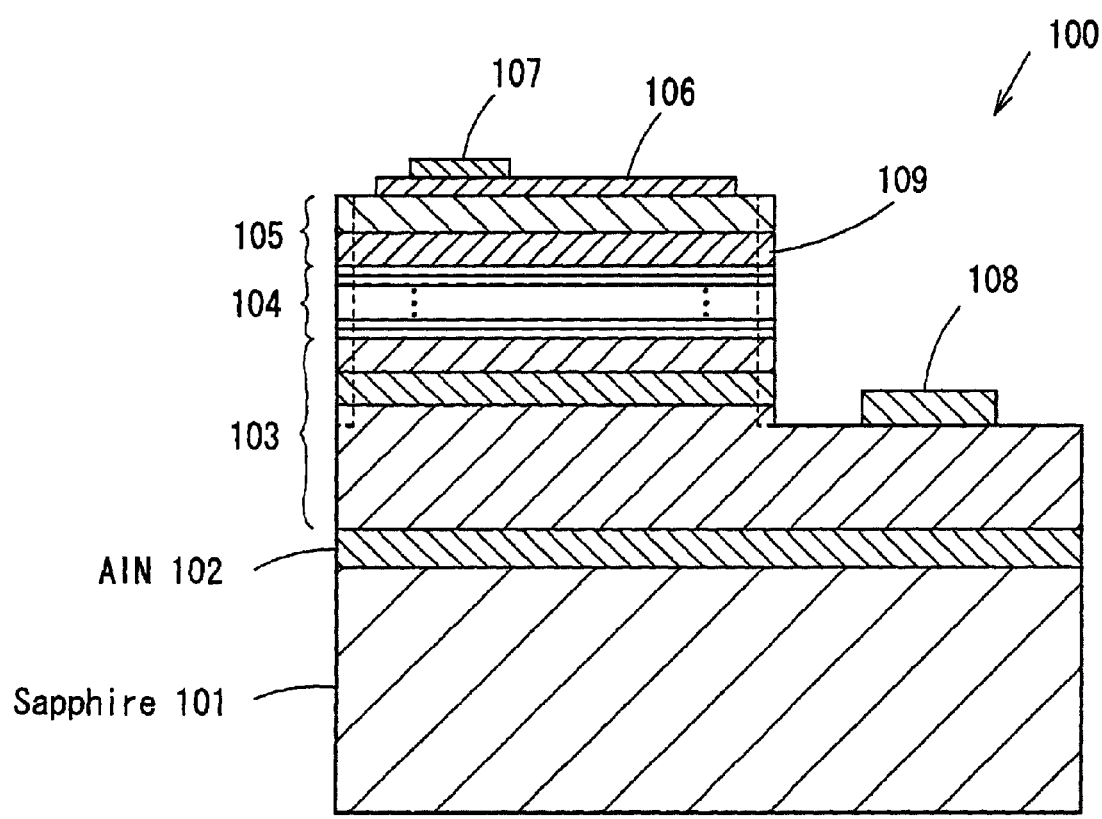
FIG. 1 is a vertical cross-sectional view of a first embodiment of a light emitting diode according to the present invention.
Figure 2:
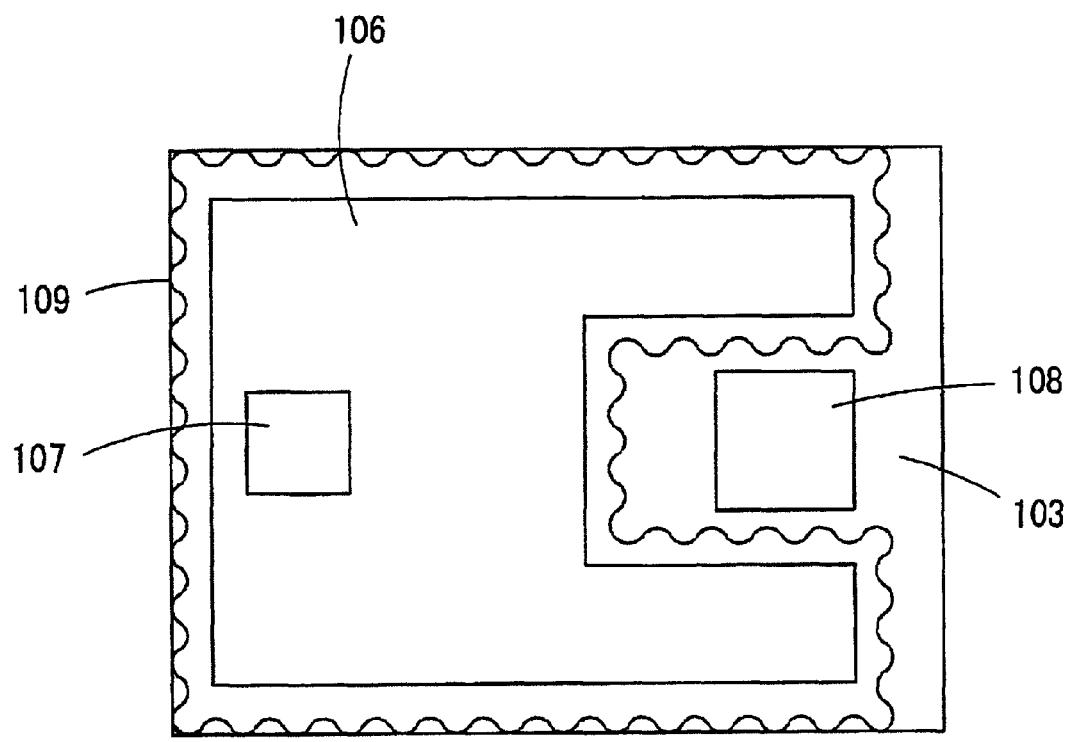
FIG. 2 is a top plan view of the first embodiment of a light emitting diode according to the present invention.

FIG. 1 and FIG. 2 illustrate a first embodiment of a light emitting element according to the present invention in the form of a light emitting diode 100. FIG. 1 is a vertical cross-sectional view of the light emitting diode 100, and FIG. 2 is a plan view thereof. The light emitting diode 100 of this embodiment employs a Group-III nitride compound semiconductor, such as a GaN-type semiconductor. The light emitting diode 100 comprises a sapphire substrate 101, a buffer layer 102, a plurality of n-type layers 103, a plurality of light emitting layers 104 which function as a light emitting region, a plurality of p-type layers 105, a light transmitting electrode (an anode) 106 formed atop the p-type layers, a pedestal electrode (an anode) 107, and an electrode (a cathode) 108 formed atop a portion of the n-type layers 103.

Except for the exposed surface of the n-type layers 103, the layers above the n-type layers 103 are etched to form the shape of a C, as shown in FIG. 2. Electrode 108 is formed on the portion of the n-type layers 103 surrounded by the C. The light emitting layers 104 may be of the MQW or SQW type.

As shown in FIG. 1 and FIG. 2, in this embodiment, an irregular side surface 109 is formed on at least the side surface of the light emitting layers 104. This irregular side surface 109 (which is shown as having a wave shape) is formed by patterning, for example, during the below-described process of forming pedestal electrode 108. As a result of the irregular side surface 109, the radiation efficiency from the light emitting layers 104; i.e., the external quantum efficiency of the light emitting diode 100 is increased.

Figure 3:
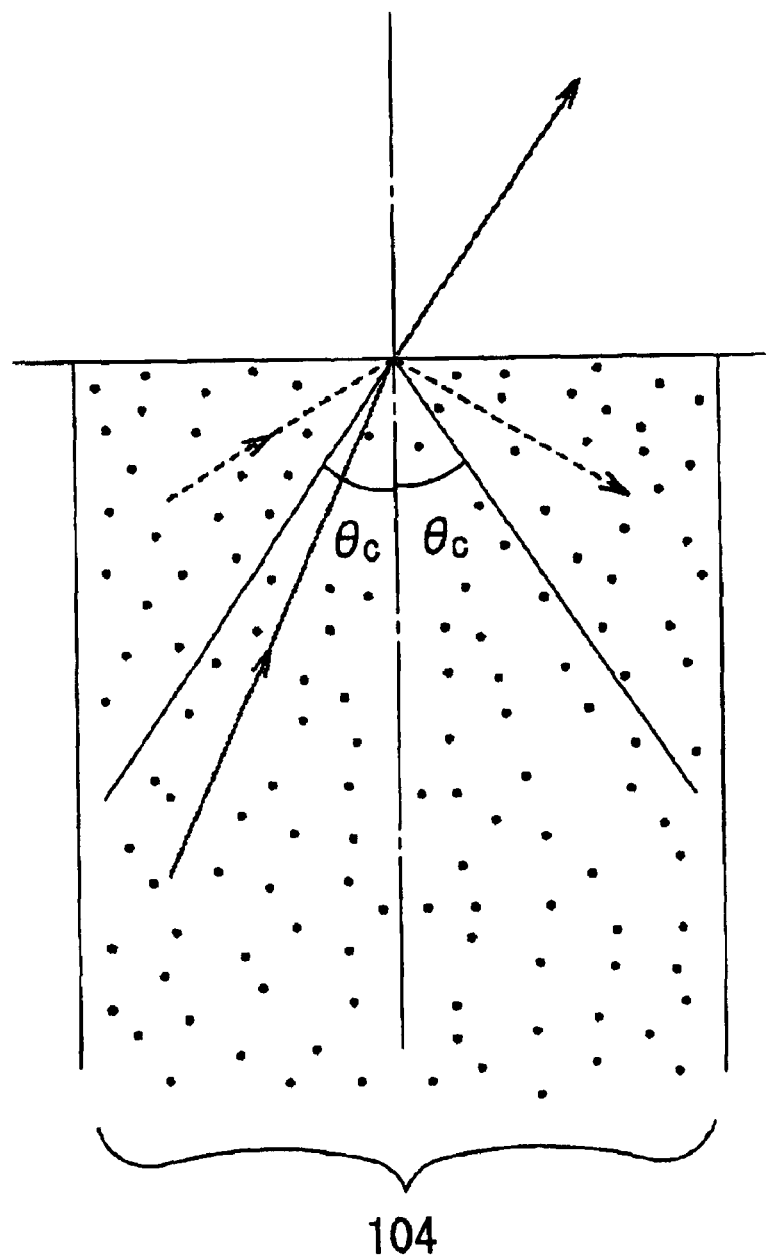
FIG. 3 is a view explaining the relationship between the path of emitted light and the critical angle θc at a light emitting interface in the present invention.

As shown in FIG. 3, if the side surface of the light emitting layers 104 were flat as was the case in the past, as the interior of the light emitting layers 104 comprises a material having a high refractive index and the exterior of the light emitting layers 104 is a material having a low refractive index, total reflection of the light emitted within the light emitting layers 104 could take place. Namely, of light directed from the interior of the light emitting layers towards the exterior, light incident upon the interface with the exterior with smaller than a critical angle θc (which is determined by the refractive indices of the light emitting layers 104 and of the material on the exterior thereof) would be radiated to the exterior, but light incident with at least the critical angle θc would be totally reflected at the interface and confined in the interior of the light emitting layers 104 and attenuated in the interior. As a result, only light incident upon the interface within a region spanning an angle measuring 2θc would be radiated to the exterior of the light emitting layers 104.

Figure 4A:
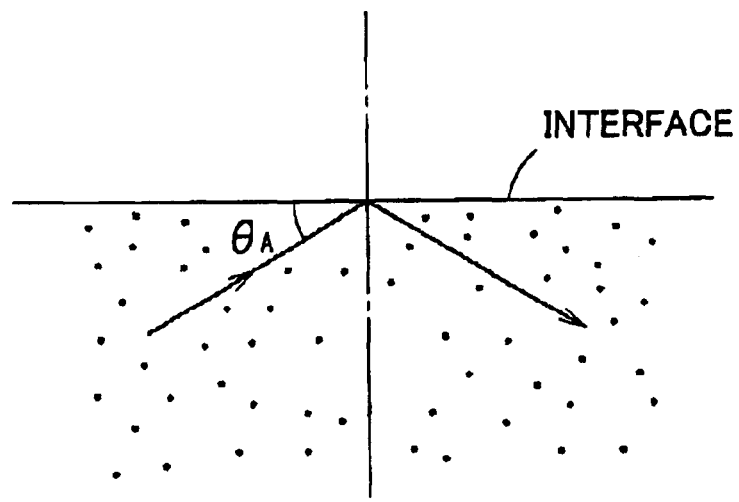
FIGS. 4A and 4B are views comparing the increase in the critical angle according to a first embodiment of the present invention with the prior art.
Figure 4B:
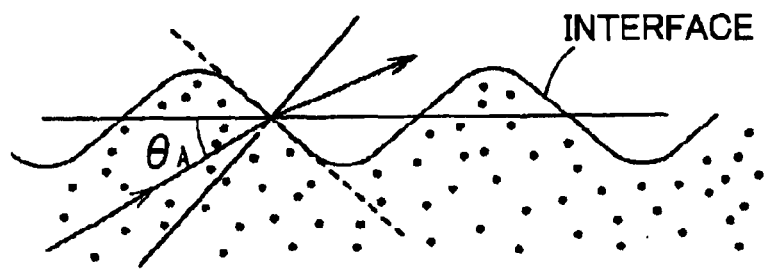

However, as shown in the enlarged view in FIG. 4B, a light emitting diode 100 according to this embodiment has an irregular side surface 109 formed on at least the side surface of the light emitting layers 104. If the interface of the light emitting layers 104 with the exterior is formed in this manner, the direction of the surface of the crystal interface varies, and the area of the interface increases, so the external radiating area at the interface increases. For example, as shown in FIGS. 4A and 4B, light which is generated under the same conditions (with an angle $\theta_A$ with respect to the interface) is totally reflected with the conventional example shown in FIG. 4A, but it is radiated to the exterior with the present embodiment shown in FIG. 4B.

Figure 13A:
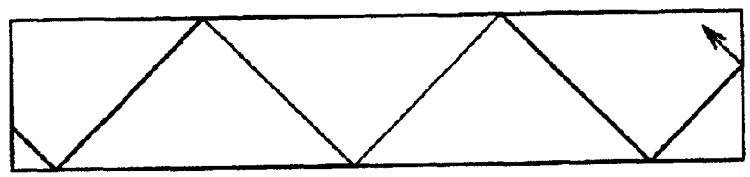
FIGS. 13A and 13B are explanatory views of light paths in a total reflection mode within a light emitting layer of a light emitting diode.
Figure 13B:
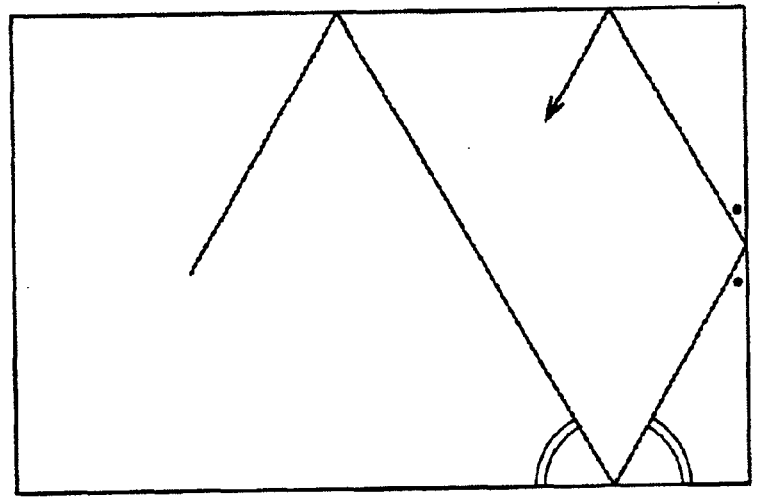

In the present embodiment, since the irregular shape of the irregular side surface 109 is a curve having a varying curvature, in addition to an increase in the primary-light extracting efficiency at the side surface of the light emitting layers, there is also a further increase extracting efficiency by multiple reflection. Namely, light which is incident on the crystal interface of the side surface of the light emitting layers with at least the critical angle θc and is totally reflected is reflected in a direction corresponding to the direction of the interface. Therefore, the above-described mode shown in FIGS. 13A and 13B for a conventional light emitting element (which typically has a rectangular shape) in which no matter how many times light is reflected within a crystal, the light is not radiated to the exterior of the light emitting element, does not take place with the present embodiment. Here, FIGS. 13A and 13B are respectively a cross-sectional view and a top plan view showing light paths in a total reflection mode of a conventional light emitting layer.

For the sake of convenience, each layer in FIG. 1 is shown as being a thick layer, but in actuality, the overall thickness of the layers is minuscule compared to the thickness of the sapphire substrate 101. However, even though the layers are very thin, they are effective not only with respect to direct light from the light emitting layers but also with respect to light which reaches the irregular side surface 109 after reflecting off the upper or lower interfaces. The refractive index of the sapphire of the substrate is 1.7, and the GaN-type semiconductor, for example, which makes up one layer of the light emitting layers and the like has a refractive index of GaN of 2.4, so light which is confined between the upper and lower interfaces of the light emitting element includes that which is confined within the light emitting element as a whole, and that which is confined within the layers of the light emitting element having a large refractive index such as the Group-III nitride compound semiconductor layer, and the light density in the layers is much higher. Therefore, it is possible to obtain an adequate effect when forming the irregular side surface 109 with even a minuscule depth.

Next, a method of manufacturing a light emitting diode 100 having the structure shown in FIG. 1 will be described. First, the buffer layer 102 to the p-type layers 105 of the light emitting diode 100 are successively formed by metal organic vapor phase epitaxy (referred to below as MOVPE). Then, an $SiO_2$ layer is formed by sputtering, a photoresist is applied atop the $SiO_2$, patterning with the irregular (wave-shaped) pattern shown in FIG. 2 is carried out, and then photolithography is performed. Next, regions of the p-type layers 105 and the light emitting layers 104 which are not covered by the photoresist and the $SiO_2$ layer and a portion of the n-type layers 103 are subjected to dry etching, and a region for an electrode is formed on the n-type layers 103, and an irregular side surface 109 is formed.

Next, a metal (such as Au, Ni, or Co) is applied by vapor deposition to a thickness of 1–200 nm, and a light transmitting electrode 106 is formed atop the p-type layers 105. Then, electrode 108 is formed atop the n-type layers 103 by vapor deposition, and pedestal electrode 107 is formed atop the light transmitting electrode 106. As described above, the irregular side surface 109 is formed as part of a process of exposing the n-type layers 103. Accordingly, it is not necessary to have a separate and independent step for forming the surface irregularities. Therefore, a light emitting element can be realized easily and inexpensively.

Figure 5:
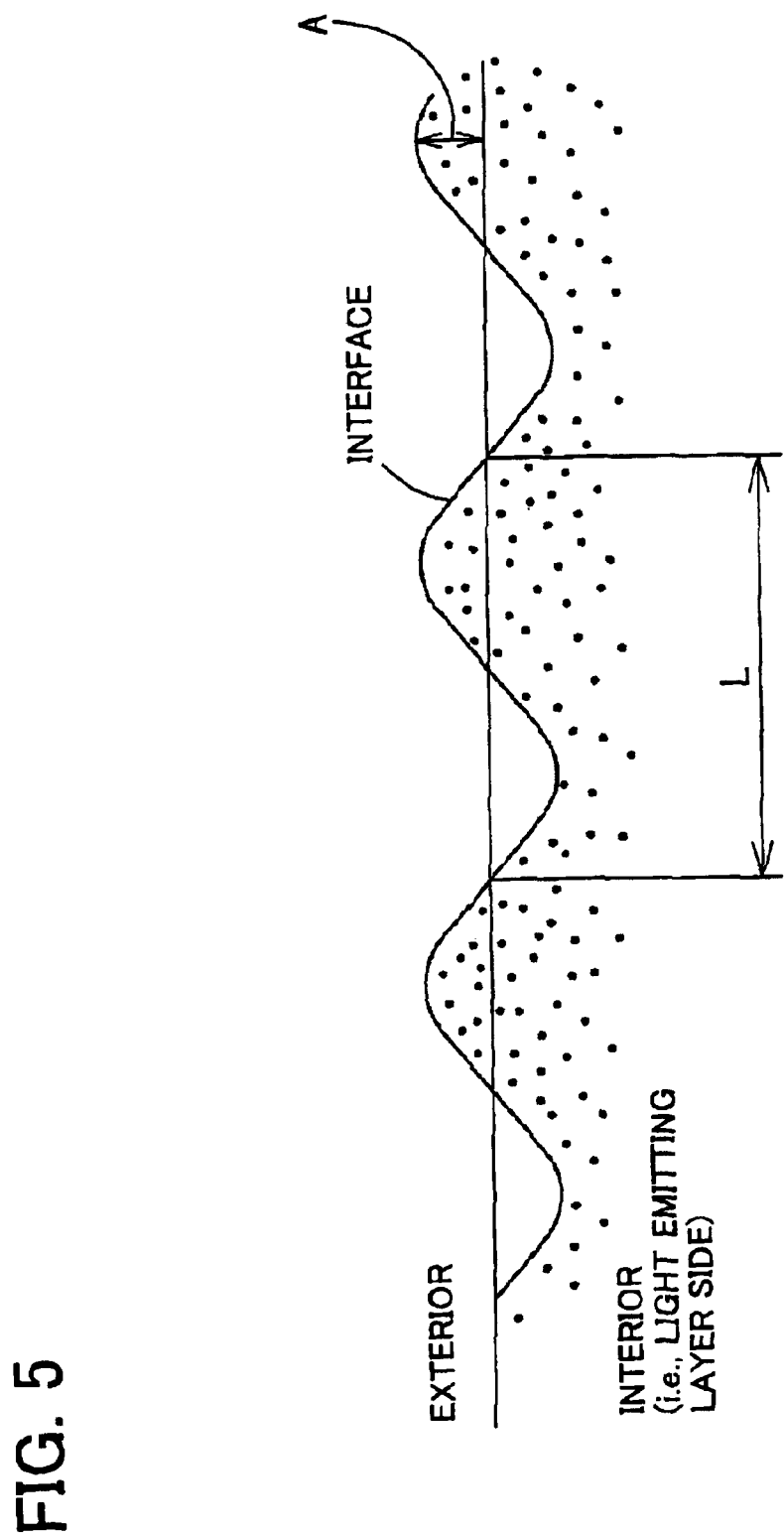
FIG. 5 is an explanatory view of the optimal shape of the irregular side surface according to a first embodiment of the present invention.

The shape of the irregular side surface 109 is preferably such that light which is radiated from any point thereon is not blocked by the adjoining irregularities on the side surface 109. If radiated light is blocked by adjoining projections, the light again enters into the light emitting layers 104, and it is thought that it is confined therein and attenuated. In addition, when the shape of the irregularities is narrow and deep, the effective external radiating area with respect to lights, which have random directions, does not increase. Accordingly, the irregularities are preferably formed so as to satisfy prescribed conditions. For example, in the present embodiment, as shown in FIG. 5, the shape of the irregularities of the irregular side surface 109 is a periodic sine wave having an amplitude A which is ¼ of the period L of the sine waves. As a result, the range in which surface direction of the crystal interface caries is increased and the area is increased and the efficiency of discharging light is increased, and thus, a light emitting diode can be manufactured having a higher light emitting efficiency than a conventional light emitting element. The above-mentioned period is a spatial period, not a temporal period.

(Second Embodiment)

In the above-described first embodiment, the irregular side surface 109 was formed during a process of exposing the n-type layers 103, but the irregular side surface 109 can also be formed during a process in which light emitting elements are separated from each other, which is a final step during the manufacture of light emitting elements. A large number of light emitting diodes 100 are normally formed simultaneously using lithography on a sapphire substrate 101, and after a series of manufacturing processes, the light emitting diodes 100 are separated from each other.

Figure 6:
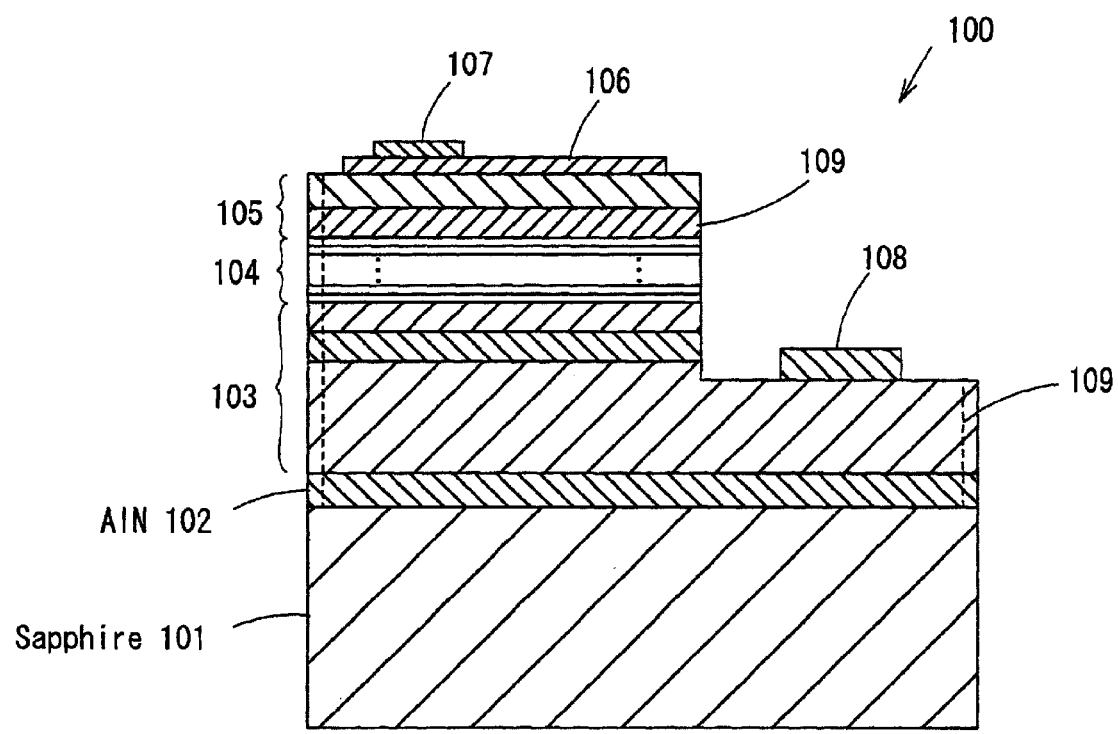
FIG. 6 is a vertical cross-sectional view of a second embodiment of a light emitting diode according to the present invention.
Figure 7:
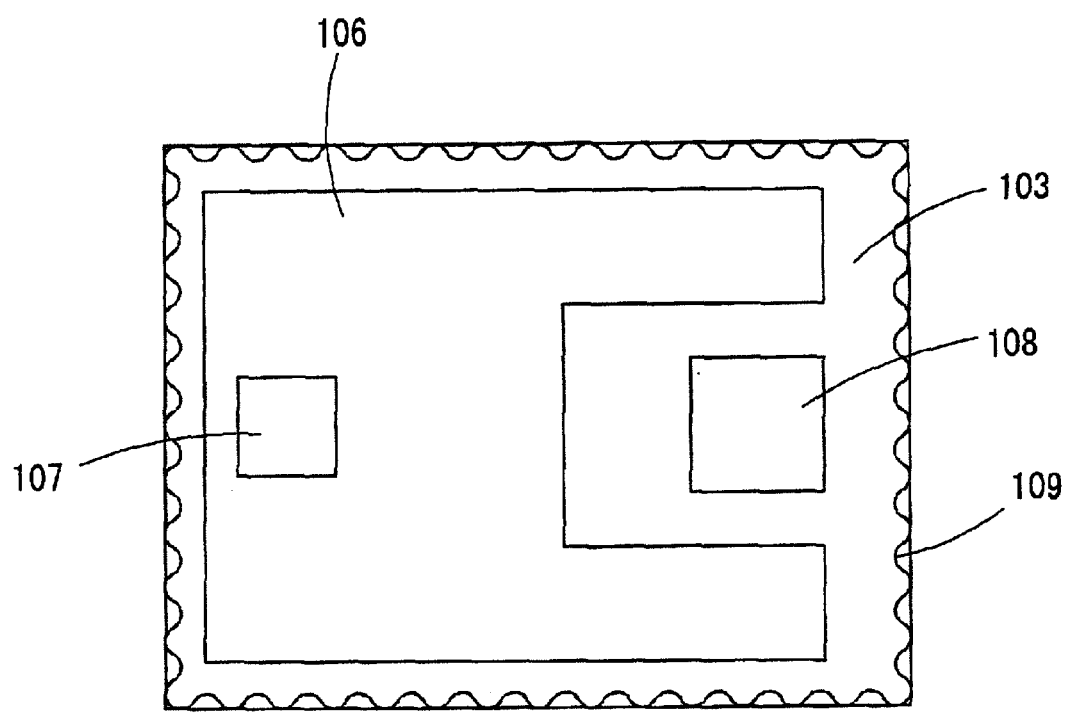
FIG. 7 is a top plan view of the second embodiment of a light emitting diode according to the present invention.

An example of an irregular side surface 109 which is formed at the time of separating light emitting elements from each other, which is a final manufacturing step, is shown in FIG. 6 and FIG. 7. FIG. 6 is a vertical cross-sectional view of a light emitting diode 100, and FIG. 7 is a top plan view of the light emitting diode 100 of FIG. 6. In FIG. 6, the dashed lines show an irregular side surface 109 which is formed at the time of separating elements from each other by a method such as etching. As a result, an irregular side surface 109 which completely covers the side surface of a GaN layer can be formed, and the efficiency of light radiation can be further increased.

Element separation can also be performed by a mechanical method such as dicing. In this case, after element separation is carried out, portions other than the side surface of the element are protected with a resist or the like, and then only the side surface is subjected to etching. As a result, irregularities having various shapes can be formed by etching. In this case, patterning is not carried out, and a rough surface is formed by etching. As a result of the surface irregularities which are formed in the side surface, a light emitting diode having a higher than conventional efficiency is obtained.

(Third Embodiment)

Figure 8:
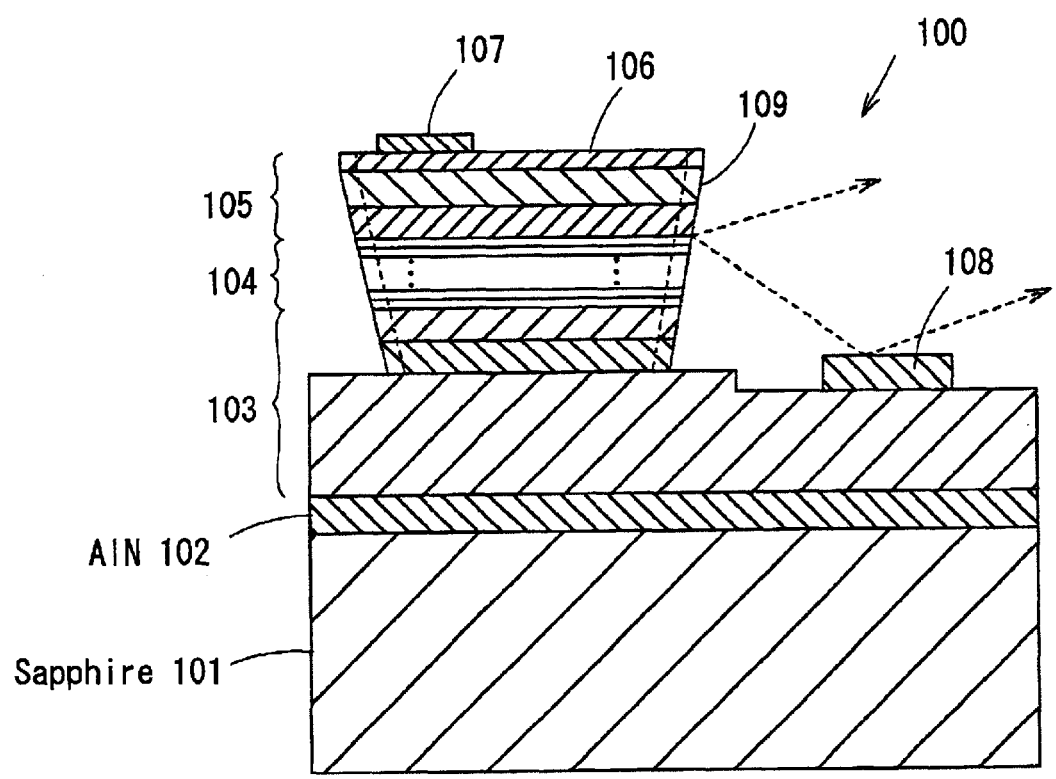
FIG. 8 is a vertical cross-sectional view of a third embodiment of a light emitting diode according to the present invention.

FIG. 8 shows a third embodiment of a light emitting element. In the first embodiment described above, the irregular side surface 109 of the light emitting diode is perpendicular with respect to the sapphire substrate 101. As a result, light from the light emitting layers 104 is radiated parallel to the surface of the sapphire substrate 101. In this third embodiment, the light emitting layers 104 are tapered so that the irregular side surface 109 is not perpendicular with respect to the substrate 101. Tapering the light emitting layers 104 increases the area of the crystal interface, and the efficiency of light radiation can be increased.

A tapered shape can be obtained by controlling the degree of vacuum, the high frequency electric power, the type of gas, the gas supply speed, and other parameters during the process of forming a region for the electrode 108 on the n-type layers 103; i.e., during the process of dry etching of the p-type layers 105, the light emitting layers 104, and a portion of the n-type layers 103.

In FIG. 8, a normal line to the side surface of the light emitting layers 104 has a negative angle of inclination with respect to the horizontal (i.e., the sapphire substrate 101) so that the light emitting layers 104 are tapered from top to bottom. However, the light emitting layers 104 may also be formed such that a normal line to the side surface of the light emitting layers has a positive angle of inclination; i.e., so that the light emitting layers 104 are tapered from bottom to top. When forming each layer, if the pattern thereof is gradually decreased in size and vapor phase growth is carried out, light emitting layers 104 which taper from bottom to top can be formed. Through formation of the light emitting layers 104 in this manner, the radiated light component which is directly directed upwards from the substrate is increased, and the visibility becomes excellent.

(Fourth Embodiment)

Figure 9:
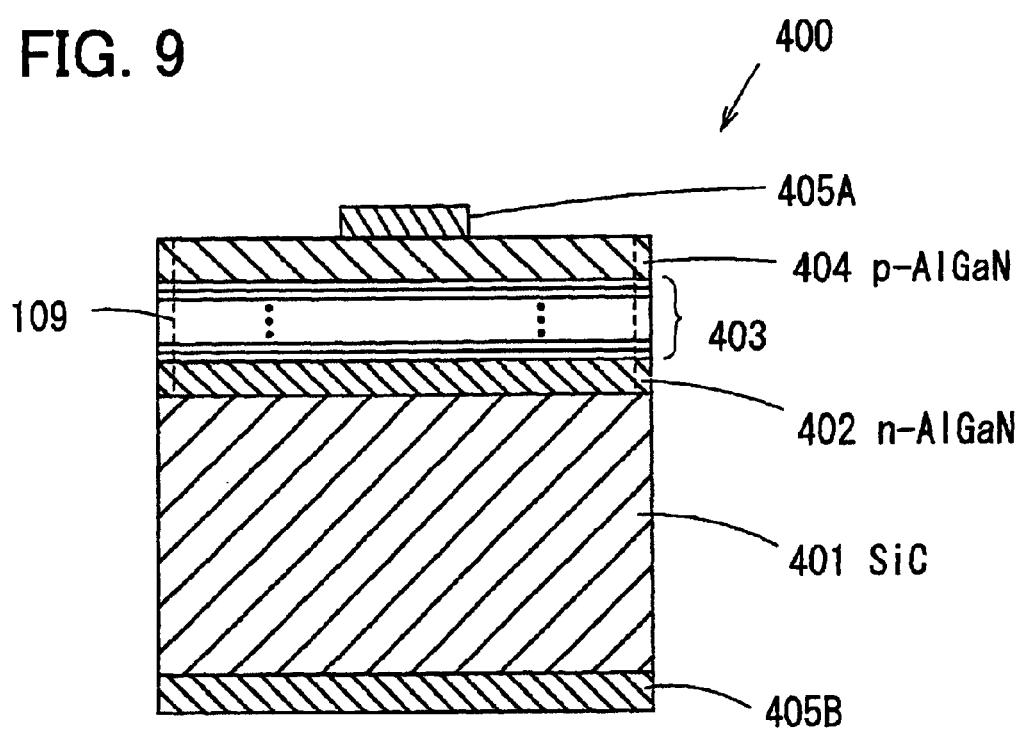
FIG. 9 is a vertical cross-sectional view of a fourth embodiment of a light emitting diode according to the present invention.
Figure 10:
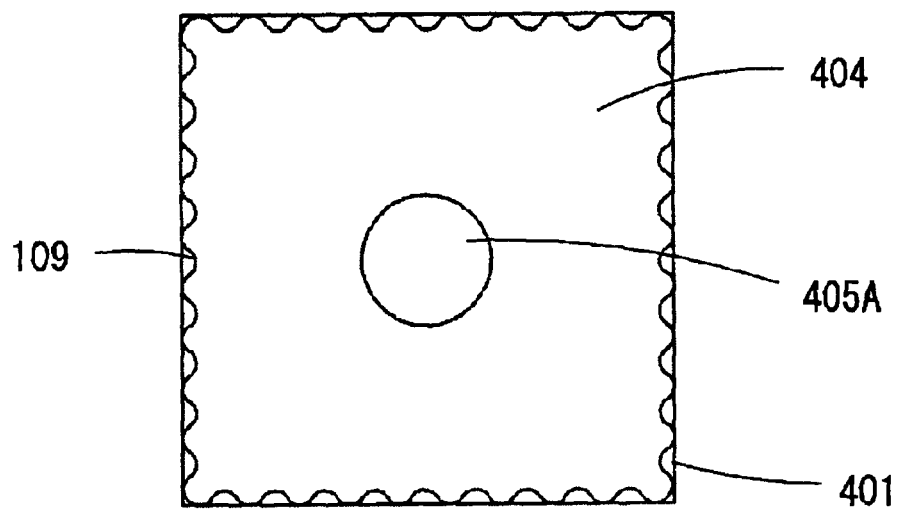
FIG. 10 is a top plan of the fourth embodiment of a light emitting diode according to the present invention.
Figure 11:
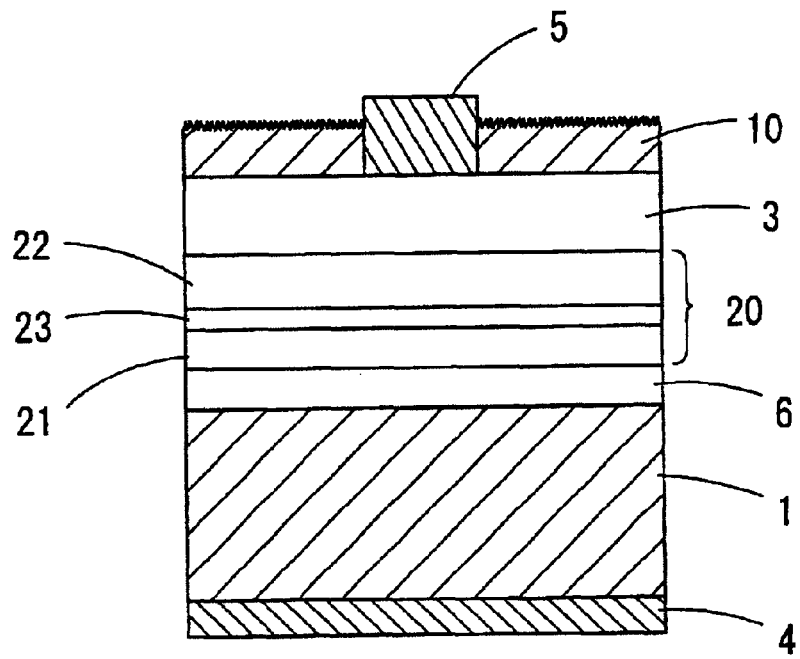
FIG. 11 is a vertical cross-sectional view of a conventional light emitting diode having a roughened top surface.
Figure 12:
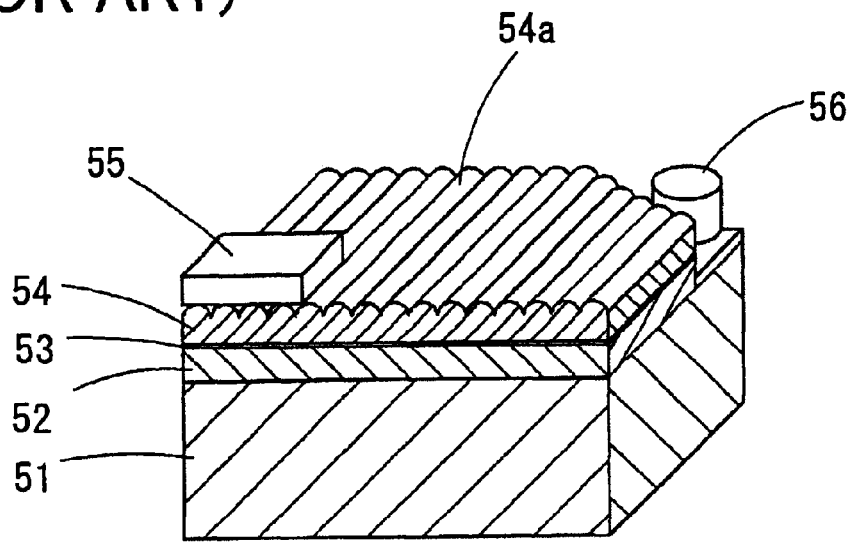
FIG. 12 is a perspective view of a conventional light emitting element having irregularities provided on its top surface.

In the first through third embodiments, positive electrodes (the light transmitting electrode 106 and the pedestal electrode 107) and a negative electrode (electrode 108) are provided on the same surface of the sapphire substrate 101. However, the present invention is not limited to this arrangement of electrodes. For example, the present invention may be a light emitting diode 400 as shown in FIGS. 9 and 10. FIG. 9 is a vertical cross-sectional view of the light emitting diode 400, and FIG. 10 is a top plan view thereof.

This light emitting diode 400 includes an SiC substrate 401, which is an electrically conducting substrate, an n-AlGaN layer 402 which is an n-type layer, MQW-type light emitting layers 403, and a p-AlGaN layer 404 which is a p-type layer. Electrodes 405A and 405B are formed on opposite sides of the above layers. This type of element can be formed by epitaxial growth (MOVPE) in the same manner as in the first embodiment. In this case, patterning is used to form wave-shape surface irregularities on all four sides as shown in FIG. 10, and each layer can be grown with this pattern. As a result, the light emitting diode 400 of FIG. 9 can be easily manufactured. With this structure as well, light which is emitted from the light emitting layers 403 has the normal lines dispersed and the area is increased, and thus, light is efficiently output.

Although the irregular side surface 109 is described as being formed by MOVPE, it can be formed by other methods. For example, after element separation, portions other than the side surface can be protected with a photoresist, and only the side surface can be roughened by etching or the like.

Some examples of materials which can be used as an electrically conducting substrate are SiC (typified by 6H-SiC), electrically conducting Si, and electrically conducting GaN.

Variations

The present invention is not restricted to the above embodiments, and many variations are possible. For example, in the first and second embodiments, a GaN-type semiconductor layer is used as a Group-III nitride compound semiconductor element, but a layer comprising $Ga_xIn_{1-x}N$ (such as $Ga_{0.08}In_{0.92}N$) and the like or a ternary or quaternary compound of the elements Al, Ga, In, and N having a desired mixed crystal ratio may be used. More specifically, a ternary (GaInN, AlInN, AlGaN) or quaternary (AlGaInN) Group-III nitride compound semiconductor expressed by the general formula $Al_xGa_yIn_{1-x-y}N$ ($0 \leq x \leq 1$, $0 \leq y \leq 1$, $0 \leq x+y \leq 1$) can be used. A portion of the N in these compounds can be replaced by a Group-V element such as P or As.

For example, when layers of a Group-III nitride compound semiconductor are formed atop a sapphire substrate, in order to obtain a product of improved crystallinity, it is preferable to form a buffer layer so as to correct lattice misfit with the sapphire substrate. It is also preferable to provide a buffer layer when using a different type of substrate. As a-buffer layer, a Group-III nitride compound semiconductor which is formed at a low temperature such as $Al_xGa_yIn_{1-x}N$ ($0 \leq x \leq 1$, $0 \leq y \leq 1$, $0 \leq x+y \leq 1$) and more preferably $Al_xGa_{1-x}N$ ($0 \leq x \leq 1$) is used. There may be a single such buffer layer, or multiple layers having different compositions may be used. A method of forming the buffer layer may be one which forms the buffer layer at a low temperature of 380–420° C., or the buffer layer may be formed by MOCVD at a temperature in the range of 1000–1180° C. In addition, high purity metallic aluminum and nitrogen gas can be used as raw materials, and a buffer layer comprising AlN can be formed by reactive sputtering using a DC magnetron sputtering apparatus. In the same manner, a buffer layer expressed by the general formula $Al_xGa_yIn_{1-x-y}N$ ($0 \leq x \leq 1$, $0 \leq y \leq 1$, $0 \leq x+y \leq 1$, with the composition ratio being arbitrary) can be formed. Furthermore, it is possible to use the vapor deposition method, the ion plating method, the laser abrasion method, or the ECR method. Formation of the buffer layer by physical vapor deposition is preferably carried out at a temperature in the range of 200–600° C. More preferably it is carried out at a temperature in the range of 300–600° C. and still more preferably in the range of 350–450° C. When a physical vapor deposition method such as these sputtering methods is used, the thickness of the buffer layer is preferably in the range of 100–3000 Angstrom. More preferably it is in the range of 100–400 Angstrom, and most preferably it is in the range of 100–300 Angstrom. Multiple layers can be formed by a method in which a layer comprising $Al_xGa_{1-x}N$ ($0 \leq x \leq 1$), for example, and a GaN layer are alternatingly formed, a method in which layers having the same composition are alternatingly formed with a forming temperature of at most 600° C. and at least 1000° C., and the like. These methods can of course be combined with each other, and the plurality of layers may be formed by laminating three or more Group-III nitride compound semiconductors of the formula $Al_xGa_yIn_{1-x-y}N$ ($0 \leq x \leq 1$, $0 \leq y \leq 1$, $0 \leq x+y \leq 1$). In general, a buffer layer is non-crystalline, and an intermediate layer is a monocrystal. A buffer layer and an intermediate layer may be formed in a single cycle, or they may be formed in plurality of cycles, and cycles may be repeated any number of times. The more repetitions the better is the crystallinity.

A high temperature growth buffer layer may be formed atop a low temperature growth buffer layer, and the Group-III nitride semiconductor which is the main body may be formed atop the high temperature growth buffer layer.

In the buffer layer and the upper layers formed of a Group-III nitride compound semiconductor, a portion of the composition of the Group-III elements can be replaced by boron (B) or thallium (Tl), and a portion of the nitrogen (N) can be replaced by phosphorus (P), arsenic (As), antimony (Sb), or bismuth (Bi). It is also possible to perform doping with these elements to an extent that the elements do not appear in the chemical compositional formula. For example, to the Group-III nitride compound semiconductor $Al_xGa_{1-x}N$ ($0 \leq x \leq 1$), which does not include indium (In) or arsenic (As) in its chemical formula, by performing doping with indium (In) which has a larger atomic radius than aluminum (Al) or gallium (Ga), or with arsenic (As) which has a larger atomic radius than nitrogen (N), expansion strains of crystals due to nitrogen atoms coming out can be compensated by compressive strains, and crystallinity can be improved. In this case, acceptor impurities easily enter into the position of the Group-III element, and thus a p-type crystal is obtained as grown.

When the buffer layer and the Group-III nitride compound semiconductor layer are base layers formed by at least two cycles, each Group-III nitride compound semiconductor layer can be doped with an element having a larger atomic radius than the primary constituent element. When forming a light emitting element, it is generally preferable to use a binary or ternary Group-III nitride compound semiconductor.

When forming an n-type Group-III nitride compound semiconductor layer, a Group-IV element or a Group-VI element such as Si, Ge, Se, Te, or C can be added as an n-type impurity. In addition, a Group-II element such as Zn, Mg, Be, Ca, Sr, or Ba or a Group-IV element can be added as a p-type impurity. These can be doped in a plurality of layers, or an n-type impurity and a p-type impurity can be doped in the same layer. A Mg-doped GaN-type semiconductor implanted with Be can be changed to a hole density of $5.5 \times 10^{16}$ to $8.1 \times 10^{19}/cm^3$ by annealing at 1100° C. for 60 seconds. The activation energy of Mg is decreased to 170 mV by implanting with Be. This is thought to be because Be breaks the bonds between Mg and hydrogen and then bonds with hydrogen. Accordingly, in order to obtain a p-type layer, Be is preferably implanted in addition to acceptor impurities such as Mg.

The dislocations in the Group-III nitride compound semiconductor layer can be decreased by lateral epitaxial growth. At this time, although a mask can be used, it is also possible to use a method which does not employ a mask and in which a step is formed, and then a lateral growth layer is formed atop a depression. A method using a step can form a spot-shaped or stripe-shaped depression on a substrate and then form a gallium nitride type compound semiconductor atop the depression, and lateral growth can be carried out atop the depression. It is also possible for there to be a gap present between the lateral growth layer and a layer beneath it or the substrate. When a gap is present, the introduction of strains due to stress is prevented, so crystallinity can be further improved. Conditions for lateral growth include a method in which the temperature is elevated, a method in which the supply of gas of a Group-III element is increased, and a method involving addition of Mg.

The p-type layers 105 to which the light transmitting electrode 106 is joined preferably employs InGaN because doing so provides a high hole density. An even higher hole density can be obtained by adding Be and Mg to the p-type layers 105. Mg is preferred as an acceptor impurity. For example, the composition is preferably $In_{0.14}Ga_{0.86}N$. It is possible to use a super lattice in the p-type layers 105. For example, in order to increase the hole density of the layer forming the light transmitting 106 and obtain good ohmic properties, it is possible to employ a super lattice comprising p-type AlGaN/p-type GaN. In addition, when current sufficiently spreads in the lateral direction in the p-type layers 105, the pedestal electrode 107 can be formed instead of the light transmitting electrode 106, When successively forming layers of a Group-III nitride compound semiconductor on a substrate, as the substrate, it is possible to use an inorganic crystal substrate such as sapphire, silicon (Si), silicon carbide (SiC), spinel ($MgAl_2O_4$), ZnO, MgO, or the like, a Group III–V compound semiconductor such as gallium phosphide or gallium arsenide, or a Group-III nitride compound semiconductor such as gallium nitride (GaN). Organic metal vapor phase growth (MOCVD or MOVPE) is preferred as a method of forming a Group-III nitride compound semiconductor layer, but molecular beam vapor phase growth (MBE), halide vapor phase growth (halide VPE), liquid phase growth (LPE), and the like may be used, and different layers may be formed by different growth methods.

In the first through third embodiments, a sapphire substrate 101 is used as a substrate, but the above-described materials may be used as a substrate. For example, when silicon carbide (SiC) is used as a substrate, the refractive index is the same as for GaN. Therefore, no light is confined just within a GaN layer between its upper and lower interface. Light is radiated with a uniform radiation strength in all directions from the light emitting point, so the radiation density which is radiated from the side surface of the light emitting layer is high, and an effect of increasing light output can be obtained by forming an irregular side surface 109 having even a very small depth. Of course, the irregular side surface 109 may also have a depth reaching the substrate. In addition, in the first through third embodiments, the case was described of a p-n junction-type GaN-type light emitting element, but as long as the light emitting element is a solid light emitting element having a light emitting region, the light emitting element may also be an MIS type, and it may employ a material such as an AlGaAs type or a GaAlInP type or the like.

In the first through fourth embodiments, the irregular side surface 109 is formed so as to have the shape of a sine wave as viewed from above, but it may be formed so as to have the shape of a sine wave as seen from the side. The effect on the external quantum efficiency is the same. In this case, concerning the visibility from above, since a normal line has a component normal to the substrate (an upwards component), the performance is further increased. In addition, the present invention is not limited to an irregular side surface having a sine wave shape. A shape such as a triangular wave or a circular arc may also be employed. As long as there are irregularities in the side surface, the external quantum efficiency can be increased over conventional values, regardless of the shape.

In the first through fourth embodiments, the side surface of the light emitting layers has an irregular shape, but in addition, irregularities may be formed by partial etching or the like on the upper surface of the light radiation surface below the light transmitting electrode 106. In this case, because light is radiated from both the side surface and the upper surface, a light emitting element can be obtained having further improved quantum efficiency.

The surface irregularities are formed primarily by dry etching or wet etching, but in addition, a liftoff method can be used in which a resist is patterned on the substrate in the shape of the projections, and after each layer is grown, the resist is removed. In addition, selective epitaxial growth can be employed in which a mask in the shape of the projections is formed on the substrate, and selective epitaxial growth is performed outside of the mask, and epitaxial growth is carried out while covering each layer with a mask.

The present invention has been described in detail with reference to the above embodiments serving as most practical and appropriate examples. However, the present invention is not limited to these embodiments, and appropriate modifications and applications can be made without deviating from the scope of the present invention.

What is claimed is:

1. A solid light emitting element comprising:
   a light emitting region having at least one layer,
   wherein at least a portion of a side surface of the light omitting region is continuously concave/convex.

2. A light emitting element as claimed in claim 1, wherein the portion of the side surface comprises continuously concave/convex curves of varying curvature.

3. A light emitting element as claimed in claim 1, wherein the portion of the side surface, which is continuously concave/convex, is tapered at an angle with respect to the light emitting region.

4. A light emitting element as claimed in claim 2, wherein the portion of the side surface, which is continuously concave/convex, is tapered at an angle with respect to the light emitting region.

5. A light emitting element as claimed in claim 1, wherein the portion of the side surface, which is continuously concave/convex, is formed by etching.

6. A light emitting element as claimed in claim 4, wherein the portion of the side surface, which is continuously concave/convex, is formed by etching.

7. A light emitting element as claimed in claim 1, wherein the portion of the side surface, which is continuously concave/convex, is formed by patterning of the light emitting region.

8. A light emitting element as claimed in claim 6, wherein the portion of the side surface, which is continuously concave/convex, is formed by patterning of the light emitting region.

9. A light emitting element as claimed in claim 1, wherein the portion of the side surface, which is continuously concave/convex, is formed when the light emitting element is separated from another light emitting element.

10. A light emitting element as claimed in claim 8, wherein the side surface, which is continuously concave/convex, is formed when the light emitting element is separated from another light emitting element.

11. A light emitting element as claimed in claim 1, wherein the light emitting element is formed atop a substrate, and the refractive index of the substrate is smaller than the refractive index of the light emitting region.

12. A light emitting element as claimed in claim 10, wherein the light emitting element is formed atop a substrate, and the refractive index of the substrate is smaller than the refractive index of the light emitting region.

13. A light emitting element as claimed in claim 1, wherein each layer formed on the substrate comprises a Group-III nitride compound semiconductor.

14. A light emitting element as claimed in claim 11, wherein each layer formed on the substrate comprises a Group III nitride compound semiconductor.

15. A light emitting element as claimed in claim 1, wherein a top surface of the light emitting element is continuously concave/convex.

16. A light emitting element as claimed in claim 14, wherein at least a portion of a top surface of the light emitting element is continuously concave/convex.

* * * * *

UNITED STATES PATENT AND TRADEMARK OFFICE
CERTIFICATE OF CORRECTION

PATENT NO. : 6,809,340 B2
DATED : October 26, 2004
INVENTOR(S) : Kato et al.

It is certified that error appears in the above-identified patent and that said Letters Patent is hereby corrected as shown below:

Column 14,
Line 11, "omitting", should read -- emitting --.

Signed and Sealed this

Twenty-second Day of February, 2005

JON W. DUDAS
*Director of the United States Patent and Trademark Office*